(12) United States Patent
Bednar et al.

(10) Patent No.: US 7,131,074 B2
(45) Date of Patent: Oct. 31, 2006

(54) NESTED VOLTAGE ISLAND ARCHITECTURE

(75) Inventors: Thomas R Bednar, Essex Junction, VT (US); Scott W Gould, South Burlington, VT (US); David E Lackey, Jericho, VT (US); Douglas W Stout, Milton, VT (US); Paul S Zuchowski, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/604,277

(22) Filed: Jul. 8, 2003

(65) Prior Publication Data

US 2005/0010887 A1 Jan. 13, 2005

(51) Int. Cl.
*G06F 17/50* (2006.01)

(52) U.S. Cl. .............................................. 716/1; 716/8

(58) Field of Classification Search ................ 716/1–8, 716/16–18
See application file for complete search history.

(56) References Cited

U.S. PATENT DOCUMENTS

| | | | |
|---|---|---|---|
| 6,480,989 B1 * | 11/2002 | Chan et al. ..................... 716/8 |
| 6,581,201 B1 * | 6/2003 | Cano et al. .................... 716/12 |
| 6,584,596 B1 * | 6/2003 | Buffet et al. .................... 716/1 |
| 6,615,395 B1 * | 9/2003 | Hathaway et al. ............. 716/6 |
| 6,631,502 B1 * | 10/2003 | Buffet et al. .................... 716/4 |
| 6,711,071 B1 * | 3/2004 | Mizuno et al. ........ 365/189.09 |
| 6,820,240 B1 * | 11/2004 | Bednar et al. ................. 716/1 |
| 6,937,496 B1 * | 8/2005 | Mizuno et al. ............. 365/115 |
| 2004/0060023 A1 * | 3/2004 | Bednar et al. ................. 716/7 |

OTHER PUBLICATIONS

Bednar et al (IEEE Managing Power and Performance for System-on-Chip Designs using Voltage Islands 2002).*

* cited by examiner

*Primary Examiner*—Paul Dinh
*Assistant Examiner*—Binh Tat
(74) *Attorney, Agent, or Firm*—Schmeider, Olsen & Watts; Anthony Canale

(57) ABSTRACT

An integrated circuit. The integrated circuit includes a parent terrain; and a hierarchical order of nested voltage islands within the parent terrain, each higher-order voltage island nested within a lower-order voltage island, each nested voltage island having the same hierarchical structure.

24 Claims, 5 Drawing Sheets

For Voltage Island Nesting Level W

|  | No Switch | with Voltage Regulator | with Header |
|---|---|---|---|
| VDDO | Vw-1 | Vw-1 | Vw-1 |
| VDDI | Vw | frac(Vw) | step(Vw) |
| VDDSS | Vw-1 | Vw-1 | Vw-1 |
| VDDN | Vw-1 | Vw-1 | Vw-1 |

NESTED VOLTAGE ISLAND ARCHITECTURE

BACKGROUND OF INVENTION

1. Field of the Invention

The present invention relates to the field of integrated circuits; more specifically, it relates to architecture for integrated circuits containing voltage islands.

2. Background of the Invention

Designing application specific integrated circuits (ASICs) and system-on-chips (SOCs) entails selecting several different designs selected from a library of designs and inserting them in a basic framework of inputs, output and power supplies. However, integrated circuit manufacturing techniques have progressed to the point where advanced ASIC and SOC integration complexity create serious problems related to the distribution of power to the cores of ASIC or SOC devices.

Some cores may be selectively powered up or down or even powered at voltages that are different from other core voltages. For example, analog cores, embedded field programmable gate arrays (eFPGA) and embedded dynamic random access memory (DRAM) cores require higher minimum voltages to function than, for example, digital complementary metal-oxide-silicon (CMOS) logic cores. In some cases, it might be advantageous to run a core at a higher voltage to increase performance. Also, some applications (e.g. battery power supplies) are sensitive to the power consumed by leakage currents in non-switching circuits within a core.

However, as orders of integration of ASIC and SOC devices becomes ever more complex, even cores themselves have internal power consumption and power distribution problems that hereto have remained un-resolved. Therefore, there is a need for a technique to resolve intra-core power consumption and power distribution problems.

SUMMARY OF INVENTION

A first aspect of the present invention is an integrated circuit comprising: a first voltage island having a hierarchical structure; and a second voltage island nested within the first voltage island, the second voltage island having the same hierarchical structure as the first voltage island.

A second aspect of the present invention is an integrated circuit comprising: a parent terrain; and a hierarchical order of nested voltage islands within the parent terrain, each higher-order voltage island nested within a lower-order voltage island, each nested voltage island having the same hierarchical structure.

A third aspect of the present invention is a method of designing an integrated circuit comprising; providing a parent terrain within the integrated circuit; placing a first voltage island having a hierarchical structure within the parent terrain; and placing a second voltage island nested within the first voltage island, the second voltage island having the same hierarchical structure as the first voltage island.

BRIEF DESCRIPTION OF DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION

For the purposes of the present invention VDDN is defined as a general power supply provided to a voltage island, VDDI is defined as a power supply present within the voltage island and distributed through a network to devices within the voltage island, VDDO is defined as a power supply of the voltage islands parent terrain and VDDSS is defined as an optional power supply to support state-saving functions within the voltage island. A parent terrain is defined as the immediate physical region in which the voltage island is placed. A parent terrain may ho the integrated circuit chip or another voltage island at some order of hierarchy of voltage islands with the integrated circuit chip. VDDG is defined as a power supply, which is always powered up whenever any of VDDN, VDDI, VDDO or VDDSS of a lower hierarchical terrain is powered up. Fencing is defined shifting the voltage level of specified circuits from VDDI to VDDO when a voltage island is powered down and from VDDO to VDDI when a voltage island is powered up.

Figure 1:
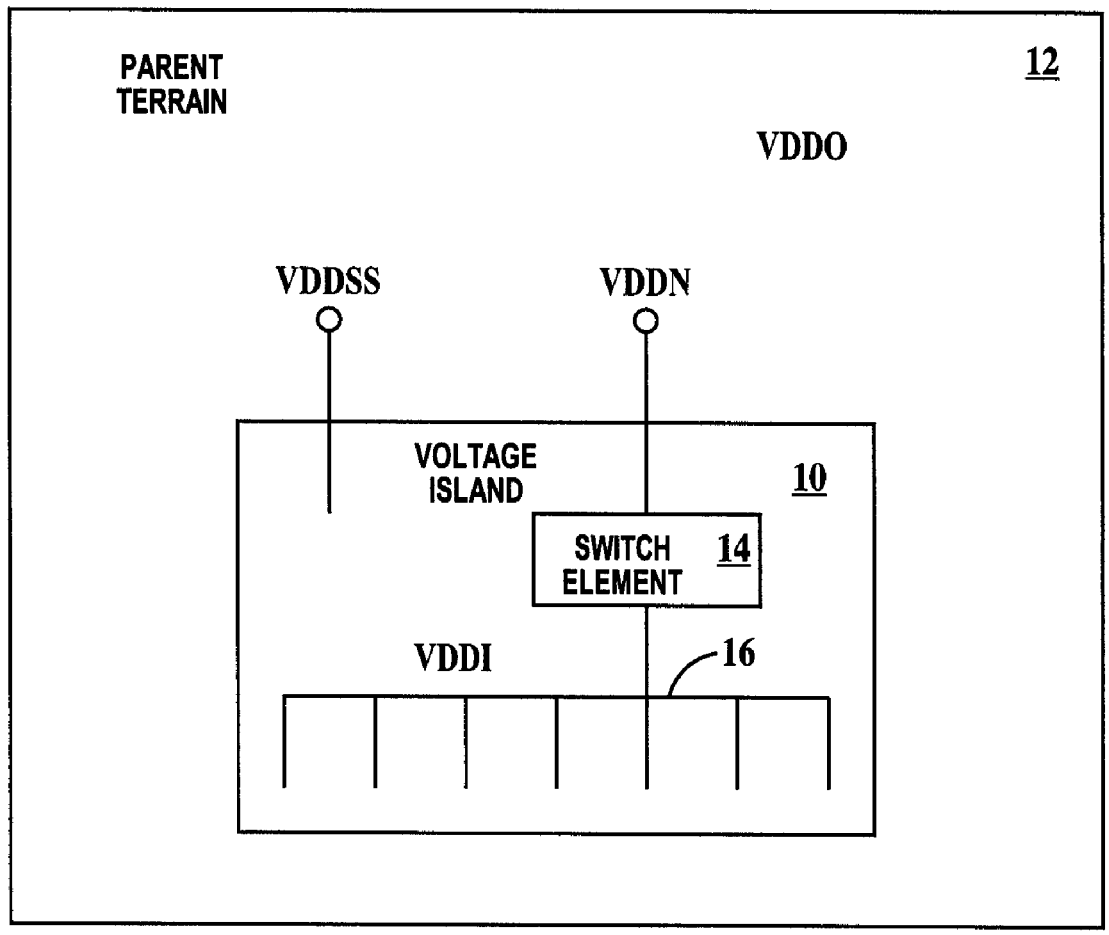
FIG. 1 is a schematic diagram illustrating the multiple voltage supplies relative to a voltage island according to the present invention.

FIG. 1 is a schematic diagram illustrating the multiple voltage supplies relative to a voltage island according to the present invention. In FIG. 1, a voltage island 10 is contained within a parent terrain 12. Parent terrain 12 may be an integrated circuit chip or another voltage island. Voltage island 10 includes an optional switch element 14 and a power distribution network 16 for supplying VDDI power to various devices such as logic gates, contained within the voltage island. The input to switch element 14 is VDDN and the output of switch element 14 is VDDI.

Switch element 14 may be a header device, a footer device, a voltage regulator or a hard connection. Footers and headers in their simplest form are essentially N-channel field effect transistors (NFETs) or P-channel field effect transistors (PFETs) used as switches. The source/drain of the PFET/NFET is coupled to VDDN and the drain/source of the PFET/NFET is coupled to power distribution network 16. The gate of the NFET/PFET is powered on/off to disconnect power distribution network 16 from VDDN. Headers connect to the VDD side of VDDN, footers connect to the GND side of VDDN. A voltage regulator either increases the value of VDDN so VDDI is higher than VDDN or decreases the value of VDDN so VDDI is lower than VDDN. If switch element 14 is a hard connection then VDDI is designated from the point where the hard connection between power distribution network 16 and VDDN is made.

Just as VDDI implies the concept of a voltage within voltage island 10, VDDO implies a concept of a voltage without voltage island 10, i.e. the general voltage of the parent terrain.

Voltage island 10 is further supplied with VDDSS. Communications across voltage island boundaries must account for differences between VDDI and VDDO such as the possibility VDDI and VDDO may be powered at different times. The states of logic latches within voltage island 10 will be lost when VDDI is powered down so circuitry to save the state of those logic latches is supplied by VDDSS.

Figures 3, 4:
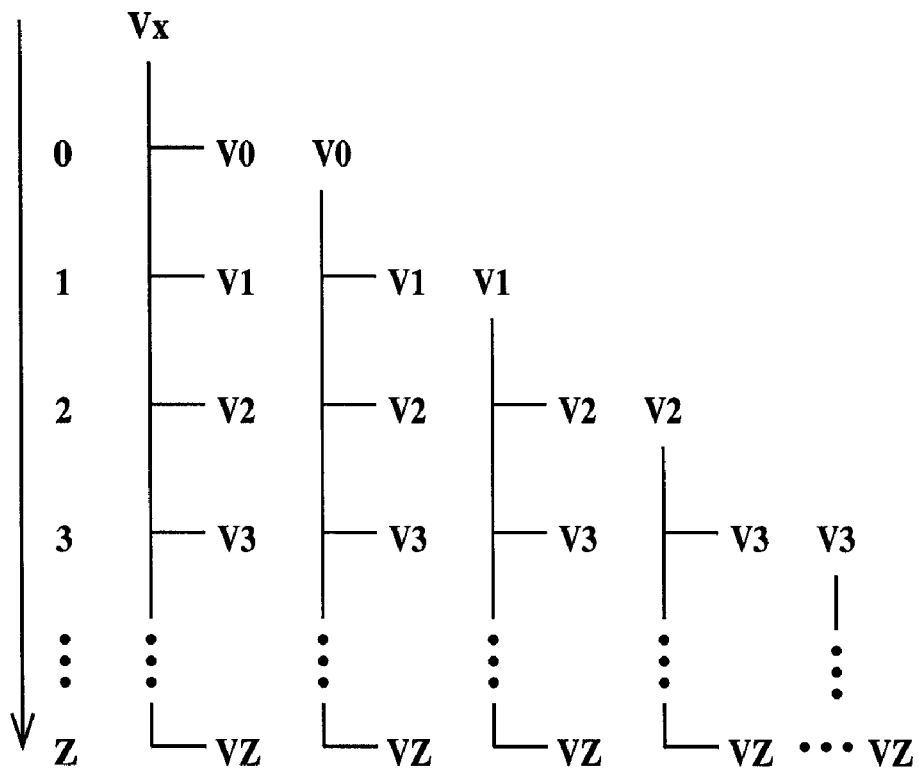
FIG. 3 is a diagram illustrating the various voltage relationships possible in a nested voltage island hierarchy according to the present invention.
FIG. 4 is a table relating the voltage structures of FIGS. 2 and 3 to the multiple voltage sources of illustrated in of FIG. 1.

VDDN, VDDI, VODO and VDDSS define all the different voltage sources required to power various functions within voltage islands. Therefore, VDDN, VDDI, VDDO and VDDSS are functional voltages. However, the voltage values of VDDN, VDDI, VDDO and VDDSS need not be different from one another and one or more of VDDN, VDDI, VDDO and VDDSS may be the same voltage value. Although PIG. I illustrates VDDSS and VDDN as being supplied from VDDO, this is not a general ease and VDDSS and VDDN were so shown to indicate they must originate from sonic higher hierarchical voltage supply. A full discussion of the hierarchical voltage supplies of the present invention is illustrated in FIGS. 3 and 4 and described infra.

The minimum hierarchical structure of every voltage island according to the present invention includes at least a VDDN power supply and voltage shifting means or fencing means or both voltage shifting means and fencing means. Additionally, every voltage island according to the present invention may further include state saving means, one or more switch elements, a VDDI power supply and associated power distribution network, a VDDSS power supply, and one or more voltage buffering circuits. If a voltage island serves as a parent tannin for another, nested voltage island, then VDDI of the parent voltage island will be the VDDO of the nested voltage island. These elements arc illustrated in FIG. 5 and discussed infra.

Figure 2:
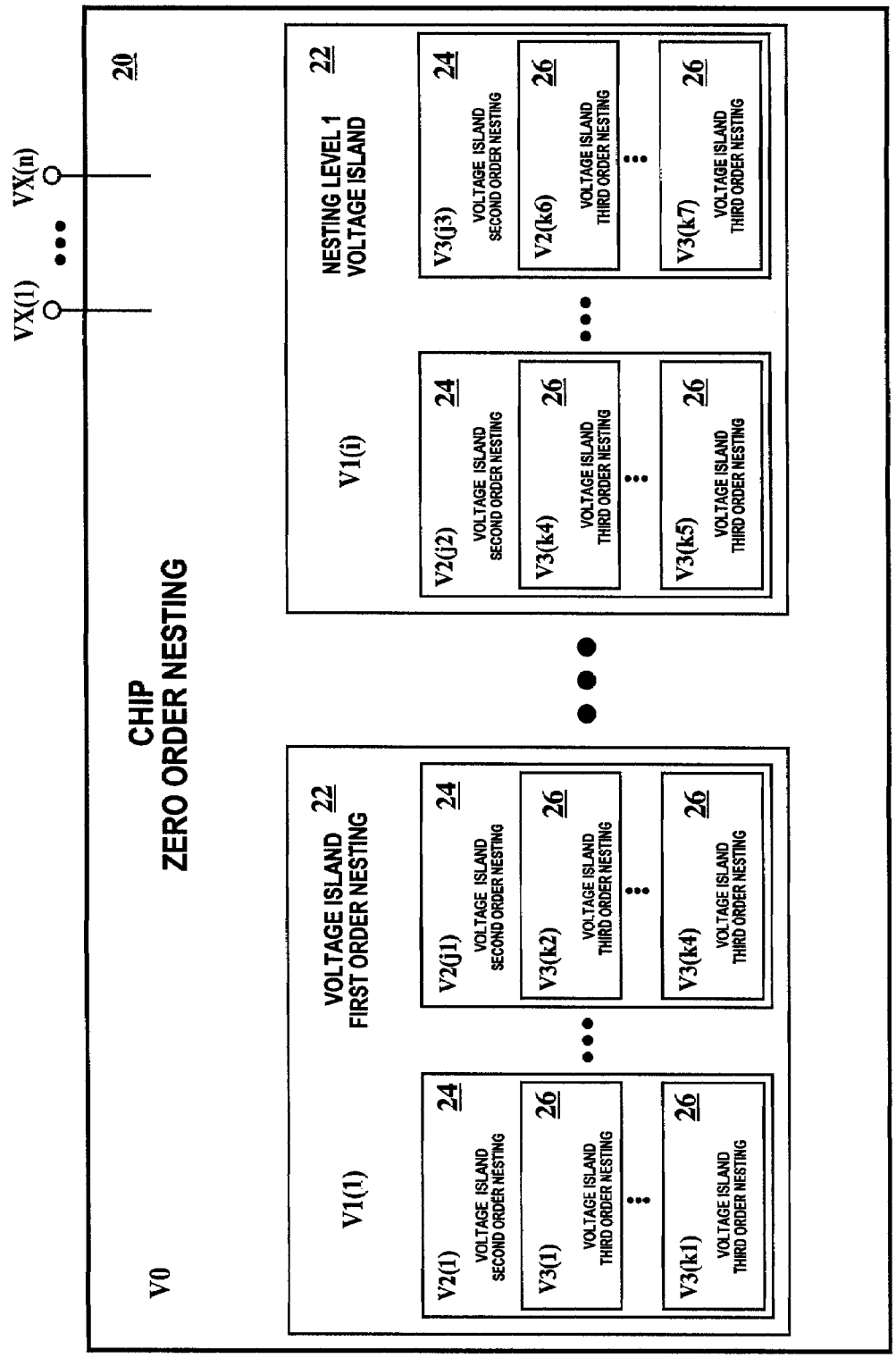
FIG. 2 is a schematic diagram illustrating a physical and voltage hierarchy of nested voltage islands according to the present invention.

Finally, it would be helpful to explore the concept of a global VDD, VDDG. VDDG is defined as a power supply that is always powered on whenever VDDN, VDDI, VDDO or VDDSS is on. The concept of nested voltages islands is illustrated in FIG. 2 and described infra. In many cases, the lowest order of hierarchy is the integrated circuit chip and the VDDO of the integrated chip is VDDG. However, it is possible that a specific voltage islands VDDI could be designated as VDDG and control the powering of its parent terrain.

FIG. 2 is a schematic diagram illustrating a physical and voltage hierarchy of nested voltage islands according to the present invention. In FIG. 2, integrated circuit chip 20 includes a multiplicity of voltage islands 22. Integrated circuit chip 20 is the parent terrain for voltage islands 22. Voltage islands 22 are first order nested. Each voltage island 22 includes a multiplicity of voltage islands 24. Each voltage island 22 is the parent terrain for voltage islands 24. Voltage islands 24 are second order nested. Each voltage island 24 includes a multiplicity of voltage islands 26. Each voltage island 24 is the parent terrain for voltage islands 26. Voltage islands 26 are third order nested. Chip 20 is the lowest order, zero nesting order. While four orders (0, 1, 2, and 3) of nesting are illustrated in FIG. 2, any number of nesting orders is possible. Note, the higher the order of a nested voltage island the deeper into the nesting the voltage island is located and the more lower-order voltage islands intervene between the higher-order nested voltage island and the parent terrain. Not all lower-order nested voltage islands need be populated with all the higher-order nested voltage islands or the same number of higher-order voltage islands in a given hierarchy of nested voltage islands. The exact configuration of nested voltage islands is purely a function of integrated chip design.

VDDI of integrated circuit chip 20 is designated as voltage order zero (V0). Integrated circuit chip 20 may also be supplied with a multiplicity of external voltage supplies VX(1) through VX(n). VDDI of voltage islands 22 is designated voltage order one (V1), VDDI of voltage islands 24 is designated voltage order (V2) and VDDI of voltage islands 26 is designated third voltage order (V3). The VDDI (i.e. V1) on each voltage island 22 may or may not differ from one another in voltage value and/or the times the voltage is on and/or the power supply from which VDDI is derived as illustrated in FIGS. 3 and 4 and described infra. The same is true for VDDI (i.e. V2) on each voltage island 24 and VDDI (i.e. V3) on each voltage island 26.

FIG. 3 is a diagram illustrating the various voltage relationships possible in a nested voltage island hierarchy according to the present invention. Nesting orders zero through Z are illustrated in FIG. 3. It can be readily seen that the power supply of any voltage order may be derived from any lower-order voltage order power supply or VX. The power supply of any given voltage order need not pass through all intervening orders power supplies. V3 may be derived from V2, V3 may be derived from V0 or V3 may be derived from V0 through V2 (skipping V1), to give a few examples.

FIG. 4 is a table relating the voltage structures of FIGS. 2 and 3 to the multiple voltage sources of illustrated in of FIG. 1. As discussed infra, VDDI of a given order voltage island relates directly to the voltage order, however there are similar relationships between VDDO, VDDSS and VDDN, though not as direct as the relationship of VDDI to voltage order. FIG. 4 illustrates for a given a voltage island of nesting order W, the nesting nearest order from which VDDO, VDDI, VDDSS and VDDN can be derived and the relationship to that order. A fractional function indicates that the voltage is a fraction of the supply voltage while a step function indicates zero or full supply voltage.

Figure 5:
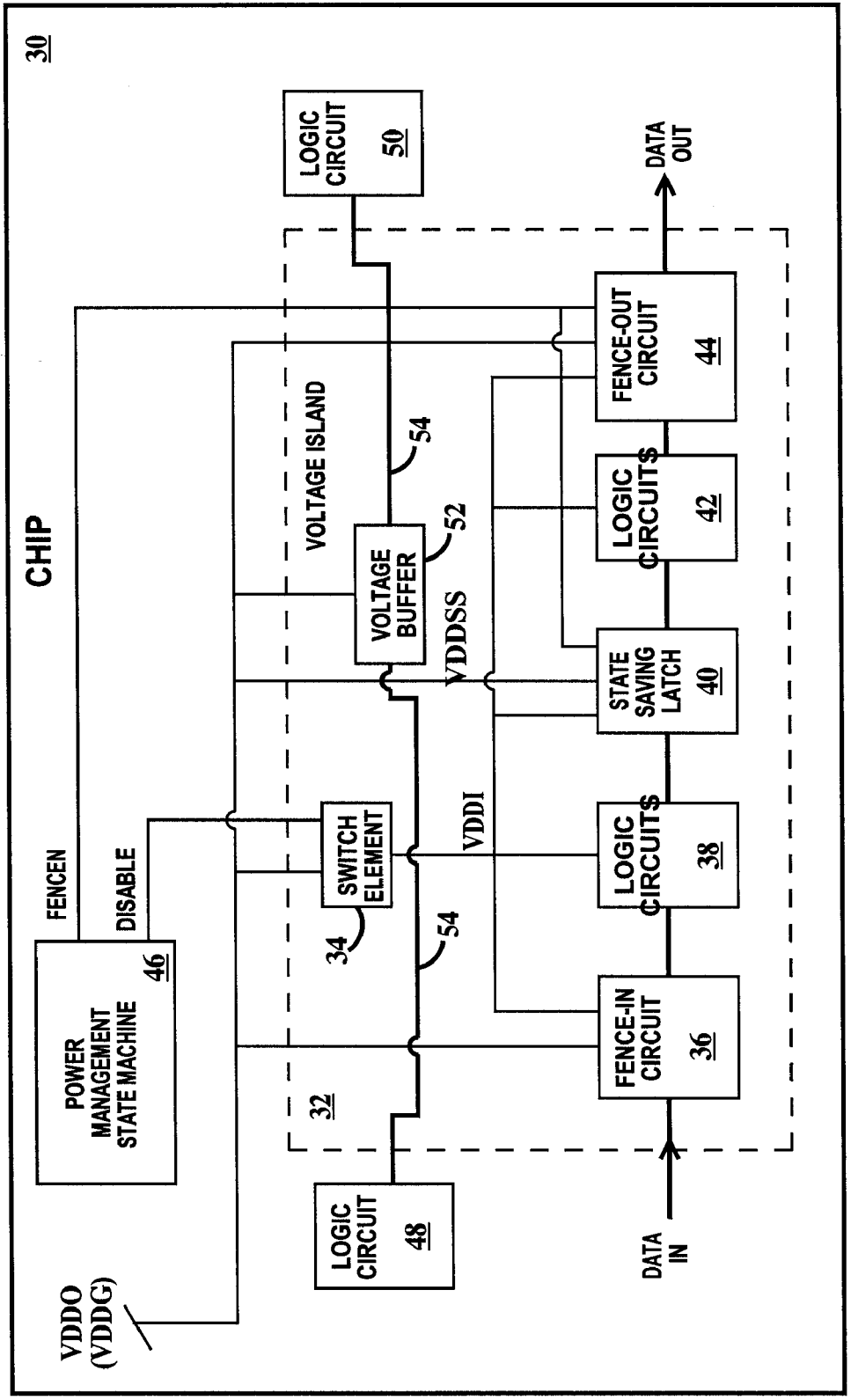
FIG. 5 is a schematic diagram illustrating the relationship between various components of a voltage islands according to the present invention.

FIG. 5 is a schematic diagram illustrating the relationship between various components of a voltage islands according to the present invention. Integrated circuit chip 30 includes a voltage island 32. Voltage island 32 includes a switch element 34, a fence-in circuit 36, a first logic circuit 38, a state saving circuit 40, a second logic latch 42 and a fence-out circuit 44. In the present example, switch element 34 is supplied from chip VDDO (which is VDDG in this example). Switch element 34 distributes VDDI to fence-in circuit 36, first logic circuit 38, state-saving latch 40, second logic circuit 42 and fence-out circuit 44. VDDO is also supplied to fence-in circuit 36, state saving latch 40 and fence-out circuit 44. State-saving latch 40 is also supplied with VDDSS (which is VDDO in this example). Integrated circuit chip 30 also includes a power management state machine 46. Power management state machine 46 is powered by VDDO. Power management state machine 46 generates a DISABLE control signal coupled to switch element 34 and a FENCEN control signal coupled to state-saving latch 40 and fence-out circuit 44. First and second logic circuits 38 and 40 are generally coupled to logic or other circuits (not shown) within voltage island 32.

FENCEN, when enabled, disables communication across voltage island boundaries and causes state-saving latch 40 to save (latch) the current contents of state-saving latch 40 prior to power down of VDDI so the state state-saving latch 40 can be restored when VDDI is powered up. DISABLE is used to turn switch element 34 off, thus depowering VDDI (if switch element is a voltage regulator or a header or footer).

To power off voltage island 30: (1) turn all clock signals into the voltage island off, (2) in response to FENCEN on, fence-in circuit 36 and fence-out circuit 44 disable data in and data communication between the voltage island and integrated circuit chip 30 and to save the state of state saving latch 40 and (3) in response to DISABLE on, switch element 34 de-couples VDDI from VDDO thus depowering the voltage island except for state saving latch 40 which powered by VDDSS.

To power on voltage island 30: (1) in response to DISABLE off, switch element 34 couples VDDI to VDDO thus powering the voltage island, (2) wait for VDDI to stabilize, (3) in response to FENCEN off, fence-in circuit 36 and fence-out circuit 44 re-establish data in and data out communication between the voltage island and integrated circuit chip 30 and to restore the state-saving latch 40, (4) perform any required power-on reset to first and second logic latches 38 and 42 and (5) turn on all clock signals into the voltage island. It is important that power management state machine 46 reside in a powered up terrain.

Integrated circuit chip 30 further includes a first logic circuit 48, a second logic circuit 50 and a voltage buffer 52. Voltage buffer 52 is supplied by voltage VDDO (VDDG). Voltage buffers boost the signal level on signal lines passing through them. First and second logic circuits 48 and 50 are not inside of voltage island 32 but a signal line 54 passes through the voltage island. This situation occurs when voltage islands are very large and the communication between first and second logic circuits 48 and 50 is sensitive to voltage drop or noise so signal line 54 must be kept as short as possible. Voltage buffer 52 is powered by VDDO so the voltage buffer is on even when voltage island 32 is powered off and can still boost the signal on line 54.

Figure 6:
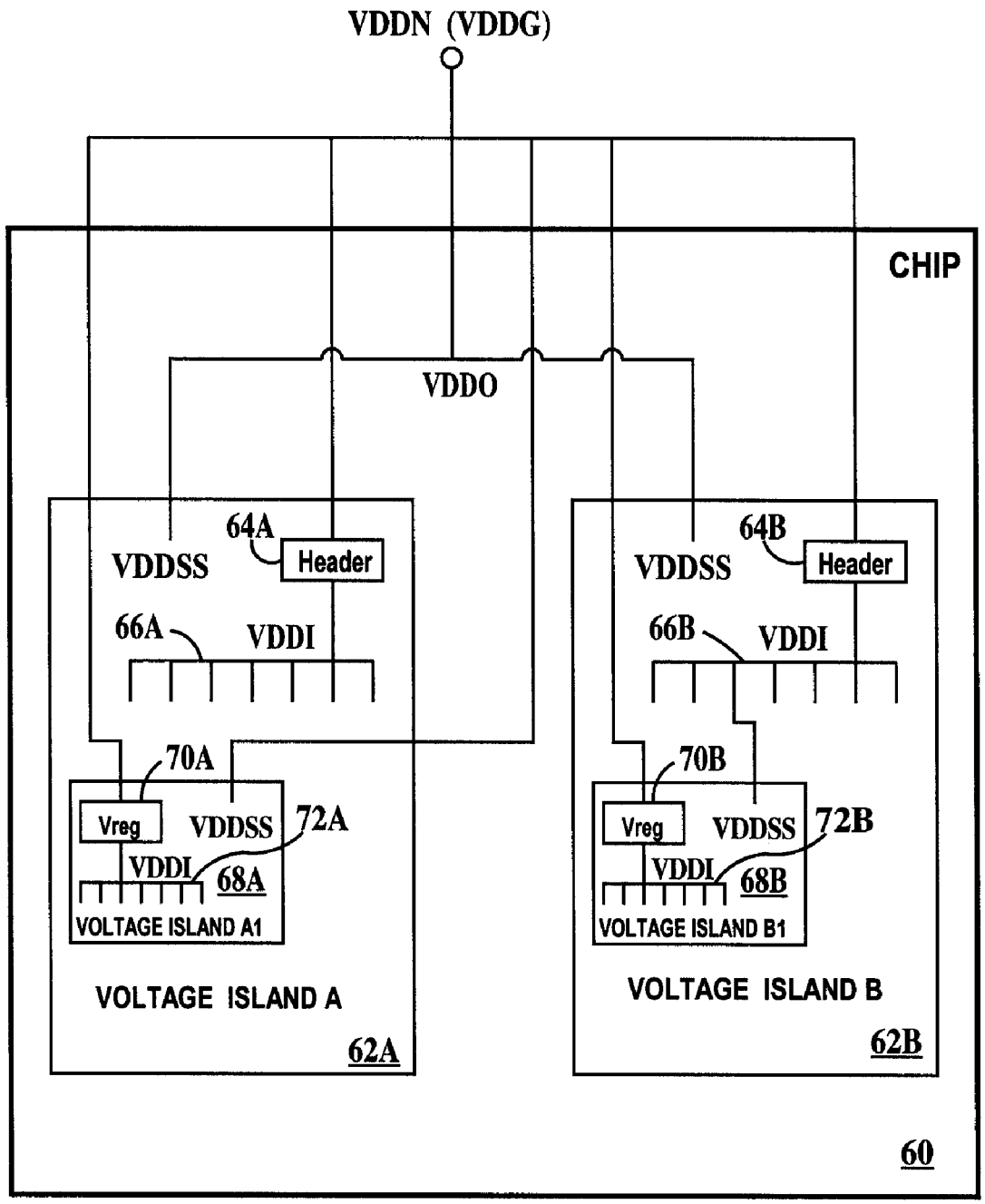
FIG. 6 is an example of a device designed according to the present invention.

FIG. 6 is an example of a device designed according to the present invention. In FIG. 6, integrated chip 60 includes a first voltage island 62A and a second voltage island 62B. First voltage island 62A includes a header 64A, a VDDI power distribution network 66A and a third voltage island 68A. Third voltage island 68A includes a voltage regulator 70A and a VDDI power distribution network 72A. Second voltage island 62B includes a header 64B, a VDDI power distribution network 66B and a fourth voltage island 68B. Fourth voltage island 68B includes a voltage regulator 70B and a VDDI power distribution network 72B.

VDDO of integrated chip 60 is powered from an off-chip VDDN (VDDG) power supply as are headers 64A and 64B and voltage regulators 70A and 70B. VDDSS of first voltage island 62A and VDDSS of second voltage island 62B are powered from VDDO. VDDSS of third voltage island 68A is powered from VDDN. VDDSS of fourth voltage island 68B is powered from VDDI of second voltage island 62B.

First and second voltage islands 62A and 62B are first order nested voltage islands, i.e. they are nested in integrated chip 60. Third and fourth voltage islands 68A and 68B are second order nested voltage islands, i.e. they are nested in a first order nested voltage island.

Fourth voltage island 68B must be powered down after second voltage island 62B powers up, and voltage island 68B must be powered down after second voltage island 62B powers down in order to preserve the state of fourth voltage island 68B because VDDSS of fourth voltage island 68B is supplied from VDDI of second voltage island 62B. Third voltage island 68A may remain powered up after first voltage island 62A powers up because VDDSS of third voltage island 68A is supplied from VDDN. However, third voltage island 68A cannot communicate with a depowered second voltage island 62B.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

The invention claimed is:

1. An electrical structure, comprising:
   a parent terrain denoted as $V_0$;
   voltage islands denoted as $V_1$ and $V_2$, said voltage island $V_1$ nested within said parent terrain $V_0$ and said voltage island $V_2$ nested within said voltage island $V_1$; and
   a logic circuit voltage power supply connected to a logic circuit and an externally supplied state saving power supply connected to a logic state saving circuit, said logic circuit and said state saving circuit within either said voltage island $V_1$ or said voltage island $V_2$; wherein each voltage island of the N voltage islands includes an externally supplied VDDN power supply and a voltage shifting means, or said externally supplied VDDN power supply and a fencing means, or said externally supplied VDDN power supply, said voltage shifting means and said fencing means; and wherein each voltage island of the N voltage islands further includes one or more substructures selected from the group consisting of an internal voltage island VDDI power distribution network, state saving means, one or more switching elements coupled between said externally supplied VDDN power supply and said internal voltage island VDDI power distribution network, and one or more voltage buffering circuits.

2. The electrical structure of claim 1, further including:
   additional voltage islands denoted as $V_3$, $V_4$, . . . , $V_N$, a voltage island $V_Z$ nested within a voltage island $V_{Z-1}$ for Z=3, 4, . . . , N, wherein N is an integer of at least 3.

3. The electrical structure of claim 2, wherein each voltage island of the N voltage islands includes one or more voltage power supplies selected from the group consisting of an internal voltage island VDDI power supply, an externally supplied state saving VDDSS power supply, an externally supplied VDDN power supply, and combinations thereof.

4. The electrical structure of claim 3, wherein said one or more power supplies of voltage island $V_X$ for X=1, 2, . . . , N are each independently coupled to one of (a) said one or more power supplies of voltage island $V_Y$, for Y=1, 2, . . . , N, X not equal to Y, (b) a VDDO power supply of said parent terrain or (c) one or more external to said parent terrain power supplies.

5. The electrical structure of claim 1, wherein said fencing means comprises logic latches.

6. The electrical structure of claim 1, wherein said one or more switching elements is selected from the group consisting of hard connections, voltage regulators, headers and footers.

7. The electrical structure of claim 1, wherein said state saving means includes at least one state saving latch.

8. The electrical structure of claim 2, wherein one or more voltage islands of the N voltage islands further includes a power management state machine coupled to an internal voltage island VDDI power supply distribution network, said power management state machine of voltage island $V_X$ for X=1, 2, ..., N located in (a) voltage island $V_Y$ for Y=1, 2, ..., N, Y less than X, or (b) in said parent terrain.

9. The electrical structure of claim 1, wherein said parent terrain is an integrated circuit chip or a voltage island within said integrated circuit chip.

10. The electrical structure of claim 1, further including:
a fence-in circuit coupled to an input of said logic circuit, an output of said logic circuit coupled to an input of said state saving circuit; and
a fence out circuit coupled to an output of said state saving latch.

11. The electrical structure of claim 10, further including:
an additional logic circuit coupled between said state saving latch and said fence-in circuit.

12. The electrical structure of claim 10, further including:
a fencing power supply connected to said fence-in and said fence-out circuits.

13. A method, comprising:
providing a parent terrain denoted as $V_0$;
nesting a voltage island $V_1$ within said parent terrain $V_0$ and nesting a voltage island $V_2$ within said voltage island $V_1$; and
providing a logic circuit voltage power supply to logic circuits and providing and an externally supplied state saving power supply to logic state saving circuits, said logic circuit and said state saving circuit within either said voltage island $V_1$ or said voltage island $V_2$; wherein each voltage island of the N voltage islands includes an externally supplied VDDN power supply and a voltage shifting means, or said externally supplied VDDN power supply and a fencing means, or said externally supplied VDDN power supply, said voltage shifting means and said fencing mean; and wherein each voltage island of the N voltage islands further includes one or more substructures selected from the group consisting of an internal voltage island VDDI power distribution network, state saving means, one or more switching elements coupled between said externally supplied VDDN power supply and said internal voltage island VDDI power distribution network, and one or more voltage buffering circuits.

14. The method of claim 13, further including:
providing additional voltage islands denoted as $V_3$, $V_4$, ..., $V_N$; and
nesting a voltage island $V_Z$ within a voltage island $V_{Z-1}$ for Z=3, 4, ..., N, wherein N is an integer of at least 3.

15. The method of claim 14, wherein each voltage island of the N voltage islands includes one or more voltage power supplies selected from the group consisting of an internal voltage island VDDI power supply, an externally supplied state saving VDDSS power supply, an externally supplied VDDN power supply, and combinations thereof.

16. The electrical structure of claim 14, wherein said one or more power supplies of voltage island $V_X$ for X=1, 2, ..., N are each independently coupled to one of (a) said one or more power supplies of voltage island $V_Y$, for Y=1, 2, ..., N, X not equal to Y, (b) a VDDO power supply of said parent terrain or (c) one or more external to said parent terrain power supplies.

17. The electrical structure of claim 14, wherein one or more voltage islands of the N voltage islands further includes a power management state machine coupled to an internal voltage island VDDI power supply distribution network, said power management state machine of voltage island $V_X$ for X=1, 2, ..., N located in (a) a voltage island $V_Y$ for Y=1, 2, ..., N, Y less than X, or (b) in said parent terrain.

18. The method of claim 13, wherein said fencing means comprises logic latches.

19. The method of claim 13, wherein said one or more switching elements is selected from the group consisting of hard connections, voltage regulators, headers and footers.

20. The method of claim 13, wherein said state saving means includes at least one state saving latch.

21. The method of claim 13, wherein said parent terrain is an integrated circuit chip or a voltage island within said integrated circuit chip.

22. The method of claim 13, further including:
providing a fence-in circuit coupled to an input of said logic circuit, an output of said logic circuit coupled to an input of said state saving circuit; and
providing a fence out circuit coupled to an output of said state saving latch.

23. The method of claim 22, further including providing an additional logic circuit coupled between said state saving latch and said fence-in circuit.

24. The method of claim 22, further including:
providing a fencing power supply connected to said fence-in and said fence-out circuits.

* * * * *